(12) United States Patent
Beng et al.

(10) Patent No.: US 12,159,962 B2
(45) Date of Patent: Dec. 3, 2024

(54) SIDE EMITTING LED PACKAGE WITH BEVEL LIGHT EMITTING SURFACE

(71) Applicant: DOMINANT Opto Technologies Sdn Bhd., Melaka (MY)

(72) Inventors: Low Tek Beng, Melaka (MY); Tan Eng Wah, Melaka (MY)

(73) Assignee: DOMINANT OPTO TECHNOLOGIES SDN BHD., Melaka (MY)

( * ) Notice: Subject to any disclaimer, the term of this patent is extended or adjusted under 35 U.S.C. 154(b) by 349 days.

(21) Appl. No.: 17/651,365

(22) Filed: Feb. 16, 2022

(65) Prior Publication Data

US 2023/0197911 A1 Jun. 22, 2023

(30) Foreign Application Priority Data

Dec. 16, 2021 (MY) .......................... PI 2021007539

(51) Int. Cl.
*H01L 33/00* (2010.01)
*G02F 1/13357* (2006.01)
(Continued)

(52) U.S. Cl.
CPC ...... *H01L 33/505* (2013.01); *G02F 1/133603* (2013.01); *H01L 25/13* (2013.01);
(Continued)

(58) Field of Classification Search
CPC ....... H01L 33/505; H01L 33/60; H01L 33/32; H01L 33/502; F21V 7/0025; F21V 7/0083; F21V 7/041
See application file for complete search history.

(56) References Cited

U.S. PATENT DOCUMENTS

2006/0238884 A1* 10/2006 Jang .................... G02B 19/0066
257/E33.073
2006/0273337 A1* 12/2006 Han ........................ H01L 24/97
257/E33.059
(Continued)

FOREIGN PATENT DOCUMENTS

KR 10-2015-0111058 A 10/2015

OTHER PUBLICATIONS

Cummins, "A better automotive display from pixel to picture with local dimming," Power Electronic Tips—An EE World Online Resource, Sep. 17, 2020, 4 pages.
(Continued)

*Primary Examiner* — Gerald J Sufleta, II
(74) *Attorney, Agent, or Firm* — Amin, Turocy & Watson, LLP (57) ABSTRACT

The described technology includes a side emitting light emitting diode (LED) package with a bevel light emitting surface, and LED displays including the disclosed LED packages. The LED package can include a substrate, an LED chip, a light converter, and a cap. The LED chip can be positioned over the substrate, and the light converter can comprise a transparent material also positioned over the substrate and surrounding the LED chip. The cap can be positioned over the light converter to inhibit emission of light perpendicular to the surface of the substrate. The outer side surfaces of the light converter can be inclined, so that the light converter is wider at the base than at the top. The incline angle can be selected to collimate emitted light. LED displays including the disclosed LED packages can include multiple LED packages affixed to a printed circuit board (PCB) along with other components.

20 Claims, 5 Drawing Sheets

(51) Int. Cl.
*H01L 25/13* (2006.01)
*H01L 33/50* (2010.01)
*H01L 33/60* (2010.01)
*H01L 33/32* (2010.01)

(52) U.S. Cl.
CPC ........ H01L 33/60 (2013.01); *G02F 1/133605* (2013.01); *H01L 33/32* (2013.01); *H01L 33/502* (2013.01); *H01L 2933/0041* (2013.01)

(56) References Cited

U.S. PATENT DOCUMENTS

| | | | | |
|---|---|---|---|---|
| 2007/0070614 | A1* | 3/2007 | Ng | G02B 19/0061 362/23.12 |
| 2009/0086508 | A1 | 4/2009 | Bierhuizen | |
| 2011/0222294 | A1* | 9/2011 | Fan | F21V 5/046 362/296.01 |
| 2014/0177229 | A1* | 6/2014 | Wang He | G02B 19/0028 362/296.01 |
| 2016/0109096 | A1* | 4/2016 | Park | G02B 5/001 362/84 |
| 2016/0284955 | A1* | 9/2016 | Oh | G02B 6/00 |
| 2016/0379964 | A1* | 12/2016 | Wang | H10K 59/35 257/89 |

OTHER PUBLICATIONS

"OSRAM Opto Semiconductors—TOPLED®," https://www.osram.com/os/products/product-promotions/led-for-general-lighting/topled.jsp, accessed Dec. 6, 2021, 2 pages.

"OSRAM Opto Semiconductors—Micro SIDELED®—Flat side-emitting device ideal for compact assembly," https://www.osram.com/os/products/product-promotions/led-for-general-lighting/micro_sideled.jsp, 2 pages.

Non-Final Office Action received for U.S. Appl. No. 18/067,341, dated Mar. 28, 2023, 48 pages.

Final Office Action received for U.S. Appl. No. 18/067,341, dated Oct. 13, 2023, 31 pages.

Office Action received for U.S. Appl. No. 18/067,341, dated Feb. 5, 2024, 35 pages.

Office Action mailed Jun. 20, 2024 for U.S. Appl. No. 18/067,341, 43 pages.

* cited by examiner

SIDE EMITTING LED PACKAGE WITH BEVEL LIGHT EMITTING SURFACE

RELATED APPLICATION

The subject patent application claims priority under 35 U.S.C. § 119 to Malaysia Pat. App. No. PI 2021007539, filed Dec. 16, 2021, and entitled "SIDE EMITTING LED PACKAGE WITH BEVEL LIGHT EMITTING SURFACE," the entirety of which application is hereby incorporated by reference herein.

TECHNICAL FIELD

The subject application generally relates to Light Emitting Diode (LED) structures and displays incorporating LEDs.

BACKGROUND

LED displays generally include many small LED elements affixed to printed circuit boards (PCBs), and one or more additional layers positioned over the LED elements. The LED elements can be activated via the PCBs to generate light for the LED display, and the light generated by the LED elements can optionally be manipulated via the additional layers.

One consideration in the design of LED elements for use in LED displays is display brightness. Displays that can achieve greater brightness are generally preferable, particularly in certain environments such as vehicles. Displays within vehicles are often in conditions such as direct sunlight or high ambient light, which can reduce the effective visibility of such displays.

Another consideration in the design of LED elements for use in LED displays is avoiding speckling and spotting effects in LED displays. For example, designs in which individual LED elements concentrate light directly at the additional layers of an LED display can lead to unwanted bright spots on the LED display, with each bright spot being produced by an individual underlying LED element. To avoid bright spots, the light generated by LED elements should be sufficiently uniform and diffuse before it traverses the additional layers.

The above-described background is merely intended to provide a contextual overview of some current issues and is not intended to be exhaustive. Other contextual information may become further apparent upon review of the following detailed description.

BRIEF DESCRIPTION OF THE DRAWINGS

The technology described herein is illustrated by way of example and not limited in the accompanying figures in which like reference numerals indicate similar elements and in which.

DETAILED DESCRIPTION

One or more embodiments are now described with reference to the drawings, wherein like reference numerals are used to refer to like elements throughout. In the following description, for purposes of explanation, numerous specific details are set forth in order to provide a thorough understanding of the various embodiments. It may be evident, however, that the various embodiments can be practiced without these specific details.

Example embodiments are directed to a side emitting LED package with a bevel light emitting surface, and LED displays including the disclosed LED packages. A side emitting LED package with a bevel light emitting surface can include a substrate, an LED chip, a light converter, and a cap. The LED chip can be positioned over the substrate, and the light converter can comprise a substantially transparent material also positioned over the substrate and surrounding the LED chip. The cap can be positioned over the light converter to inhibit emission of light perpendicular to the surface of the substrate. The outer side surfaces of the light converter can be inclined, so that the light converter is wider at the base, adjacent to the substrate, than at the top, adjacent to the cap. The incline angle can be selected to collimate light emitted from the LED package. LED displays including the disclosed LED packages can include multiple of the disclosed LED packages affixed to a printed circuit board (PCB) along with various other components described herein. Further aspects and embodiments of this disclosure are described in detail below.

Figure 1:
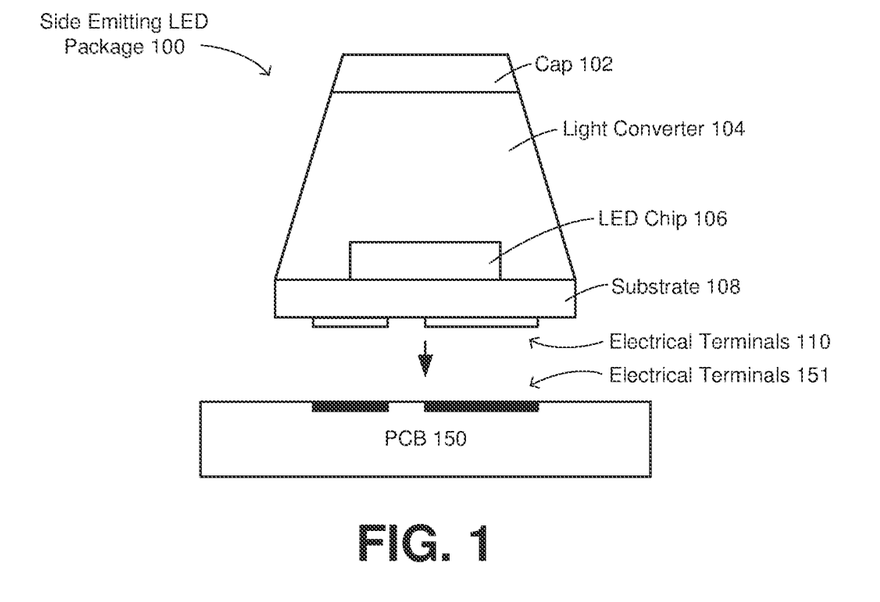
FIG. 1 illustrates an example side emitting LED package, in accordance with one or more embodiments described herein.

FIG. 1 illustrates an example side emitting LED package, in accordance with one or more embodiments described herein. The example side emitting LED package 100 comprises a cap 102, a light converter 104, an LED chip 106, a substrate 108, and electrical terminals 110. The electrical terminals 110 are configured to couple with electrical terminals 151 of a PCB 150.

When the electrical terminals 110 of the side emitting LED package 100 are coupled with the with electrical terminals 151 of the PCB 150, the side emitting LED package 100 can be operated via the PCB 150. The side emitting LED package 100 can be activated, causing the LED chip 106 to emit light. Light emitted by the LED chip 106 passes through the light converter 104 and the light is emitted from the sides of the light converter 104.

Figure 2:
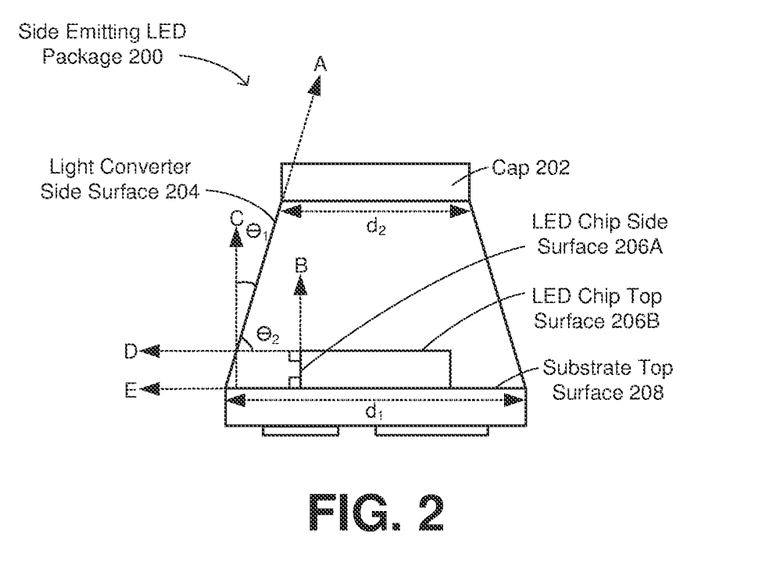
FIG. 2 illustrates another example side emitting LED package and various example angles and dimensions thereof, in accordance with one or more embodiments described herein.

FIG. 2 illustrates another example side emitting LED package and various example angles and dimensions thereof, in accordance with one or more embodiments described herein. The example side emitting LED package 200 comprises a cap 202 which has a different shape than cap 102. Otherwise, the components of the side emitting LED package 200 are similar to those of side emitting LED package 100 illustrated in FIG. 1. In general, numerous potential modifications to the shapes and sizes of the illustrated components, including the cap 202 as well as the light converter 104, LED chip 106, substrate 108, and electrical terminals 110, can be made in accordance with embodiments of this disclosure, and this disclosure is not limited to any particular component shapes or dimensions unless explicitly stated otherwise.

FIG. 2 illustrates a ray A that extends upward from a light converter outer side surface, wherein the ray A is parallel with the light converter outer side surface. FIG. 2 furthermore illustrates a ray B that extends upward from an LED chip side surface, wherein the ray B is parallel with the LED chip side surface. FIG. 2 furthermore illustrates a ray C that is parallel with the ray B, in order to illustrate an inclined angle $\Theta_1$. The inclined angle $\Theta_1$ also represents the angle at which rays A and B intersect, as can be appreciated. The term "inclined angle" as used herein includes any angle other than 90 degrees (perpendicular) and 0 degrees (flat).

FIG. 2 furthermore illustrates a ray D that extends outward from an LED chip top surface, wherein the ray D is parallel with the LED chip top surface. When the LED chip is rectangular, as in FIG. 2, the rays B and D are perpendicular, as shown. The ray D intersects the ray A at an inclined angle $\Theta_2$. FIG. 2 furthermore illustrates a ray E that extends outward from a substrate top surface, wherein the ray E is parallel with the substrate top surface. In FIG. 2, the substrate top surface is parallel to the LED chip top surface and the substrate top surface is perpendicular to the LED chip side surface, and so rays E and D are parallel, rays E and B are perpendicular, and rays D and E both intersect the ray A at a same inclined angle $\Theta_2$.

FIG. 2 furthermore illustrates a distance di, which can represent a width at the base of the light converter, i.e., the width of the portion of the light converter that is adjacent the substrate. Another distance $d_2$ can represent a width at the top of the light converter, i.e., the width of the portion of the light converter that is adjacent the cap 202. The distance $d_1$ and $d_2$ can be used, e.g., in connection with measuring the perimeter of the light converter adjacent the substrate and the perimeter of the light converter adjacent the cap.

Figure 7:
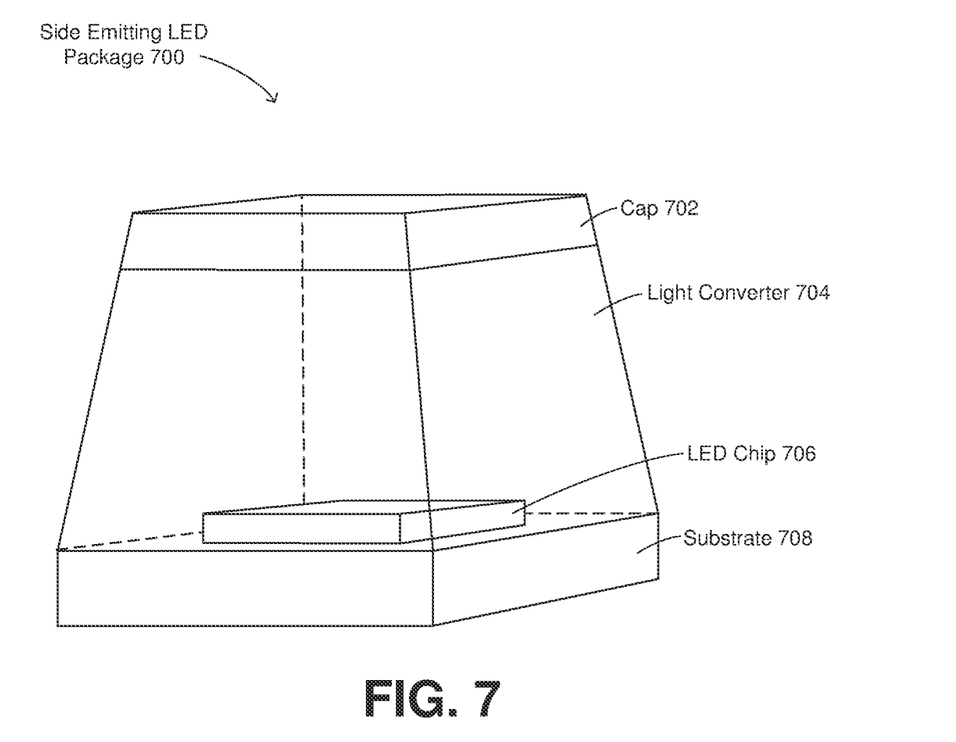
FIG. 7 is a three-dimensional view of another example side emitting LED package, in accordance with one or more embodiments described herein.

FIGS. 1, 2 and the various other illustrations herein provide side views of three-dimensional components, as can be appreciated. Example three dimensional components of a side emitting LED package are illustrated in FIG. 7. In general, side emitting LED packages according to embodiments of this disclosure can include light converter outer side surface(s) that are at inclined angle(s), as shown. The inclined angle(s) are described herein as inclined with respect to components of the side emitting LED package, such as the LED chip top surface, the substrate top surface, the LED chip side surface, or, e.g., the bottom surface of the cap 202. The inclined angle(s) are also described herein as differences in width or perimeter between the base of the light converter, having width di, and the top of the light converter, having width $d_2$. The inclined angle(s) are furthermore described herein by describing surfaces such as the light converter outer side surface(s), the LED chip top surface, the substrate top surface, and the LED chip side surface as portions of respective planes, while specifying that the respective planes can intersect at inclined angle(s).

Figure 3:
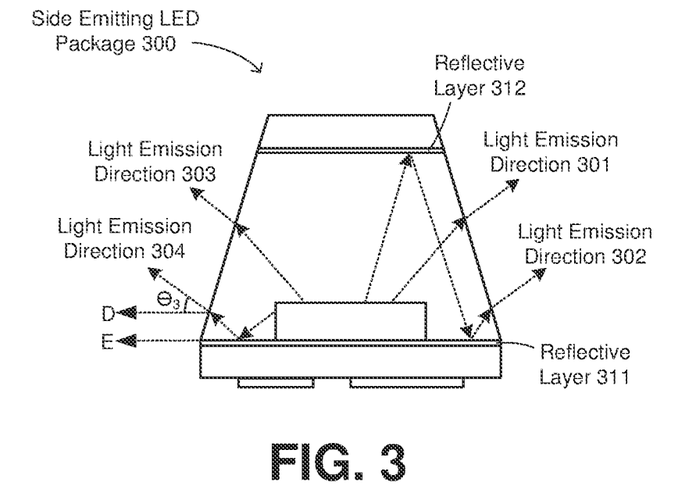
FIG. 3 illustrates example light emission from a side emitting LED package, in accordance with one or more embodiments described herein.

FIG. 3 illustrates example light emission from a side emitting LED package, in accordance with one or more embodiments described herein. FIG. 3 includes an example side emitting LED package 300 having components generally similar to those introduced in FIG. 1. In FIG. 3, the cap includes an example reflective layer 312, and the substrate also includes a reflective layer 311.

Light rays can be emitted by the LED chip in all directions, and various example light rays are illustrated in FIG. 3. Some of the light rays reflect off of the reflective layer 311, the reflective layer 312, or both. Regardless of whether light rays reflect off of the reflective layers 311, 312, the light rays eventually exit the side emitting LED package 300 in multiple different light emission directions. Example light emission directions 301, 302, 303, and 304 are illustrated in FIG. 3. Example light emission direction 304 is illustrated as having an emission angle $\Theta_3$ with respect to the rays D and E, which are parallel to the LED chip top surface and substrate top surface, as described in connection with FIG. 2.

Due to the inclined angle(s) of the light converter outer side surface(s), a combination of all light emission angles, such as an average light emission angle or other combination of light emission angles, can be an upward sloping angle, as illustrated in FIG. 3. As a result, displays made with side emitting LED packages described herein can achieve greater brightness, without speckling or spotting effects that could result from removing the cap. The slope of the inclined angle(s) of the light converter outer side surface(s) can be adjusted as needed for particular embodiments, to achieve the desired light emission directions 301, 302, 302, 304.

Figure 4:
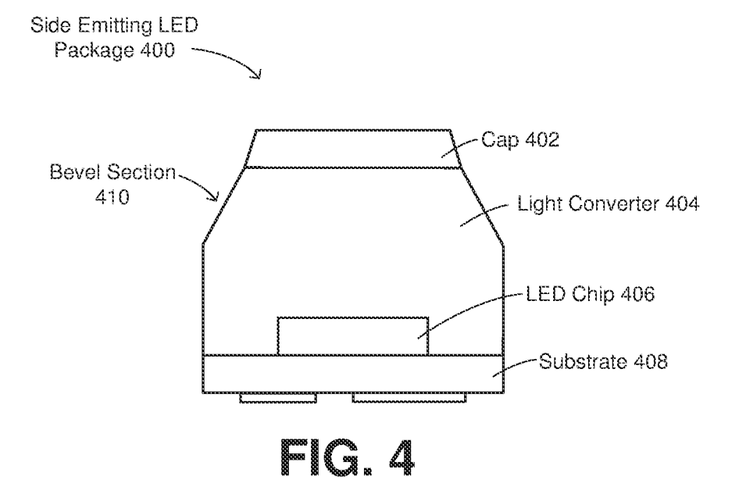
FIG. 4 illustrates another example side emitting LED package, in accordance with one or more embodiments described herein.

FIG. 4 illustrates another example side emitting LED package, in accordance with one or more embodiments described herein. The example side emitting LED package 400 includes a cap 402, a light converter 404, an LED chip 406, and a substrate 408, which are generally similar to the cap 102, light converter 104, LED chip 106, and substrate 108 introduced in FIG. 1. In FIG. 4, the light converter 404 includes a bevel section 410. The light converter 404 outer side surface(s) are at an inclined angle in the bevel section 410, while the light converter 404 outer side surface(s) are otherwise not at an inclined angle outside the bevel section 410. The light converter 404 can be shaped with a full bevel or partial bevel to adjust the light emission intensity versus emission angle of the side emitting LED package 400. FIG. 4 also demonstrates that there are multiple different approaches to configuring the light converter 404 so that the light converter 404 outer side surface(s) have an inclined angle as described herein.

With regard to FIGS. 1-4, in some embodiments, the substrate components, e.g., substrate 108, can provide a planar surface for mounting of the LED chip 106. Substrate 108 can furthermore provide electrical connectivity to the LED chip 106 from the substrate top surface, and electrical connectivity to a solder pad or other electrical terminals 151 at the bottom side of the side emitting LED package 100. The substrate 108 can be fabricated from a laminate material, e.g., a glass-reinforced epoxy laminate such as FR4, or a bismaleimide triazine (BT) laminate. The substrate 108 can optionally be fabricated using a metal lead frame with molded epoxy resin. For superior light extraction, the surface of the substrate 108 can be coated/laminated with white reflective layer 311 which can optionally have a light reflectivity of 90% or greater.

In some embodiments, the LED chip 106 can be an indium gallium nitride (InGaN) type LED chip. Some example InGaN type LED chips can be adapted to emit light in the near ultraviolet spectrum, e.g., light having wavelengths in the range of 360 nanmometers (nm) to 420 nm. Other example InGaN type LED chips can be adapted to emit light in the blue spectrum, e.g., light having wavelengths in the range of 440 nm to 480 nm.

The LED chip 106 can optionally comprise a "flip chip" type base, with both positive (P) and negative (N) terminals at the bottom of the LED chip 106. Alternatively, the LED chip 106 can comprise a vertical chip base, with a P terminal on top of the LED chip 106 and an N terminal at the bottom of the LED chip 106. In another alternative embodiment, the LED chip 106 can comprise a lateral chip base, with both P and N terminals on the top surface of the LED chip 106, and bonded with metal wire.

The LED chip 106 can attach to the substrate 108 by way of, e.g., Eutectic full metal bonding using for example gold-tin (AuSn) or tin-silver-copper (SnAgCu). Alternatively, the LED chip 106 can attach to the substrate 108 using a conductive or non-conductive adhesive.

In some embodiments, the light converter 104 can be made from a mixture of resin and light conversion particles. Example resins suitable for the light converter 104 include epoxy based resins and silicone based resins. The resin can be heat curable or ultraviolet curable. To enhance light extraction from InGaN chip, the material used in the light converter 104 can have a reflective index in the range of 1.3 to 1.6, inclusive.

The light conversion particles in the light converter 104 can include, e.g., phosphor particles. Example phosphor particles include yttrium aluminum garnet (YAG), beta-sialon, potassium fluorosilicate (KSF), silicate and quantum dot particles. Mixtures of different light conversion particles can optionally be used to achieve a specific white light target with good National Television Standards Committee (NTSC) color gamut coverage, e.g., especially for liquid crystal display (LCD) television backlight applications.

In some embodiments, the light converter 104 can be shaped to include a light converter outer side surface which is at an inlined angle in reference to a LED chip 106 side surface, as described with reference to FIG. 2. For example, a light converter 104 outer side surface can be shaped to comprise an inclined angle in the range of 2 to 20 degrees, inclusive, in reference to the LED chip 106 side surface.

The inclined angle can be selected so that light rays that exit the side emitting LED package 100 are collimated to a defined direction, e.g., upwards from the side emitting LED package, in order to enhance light extraction efficiency. The inclined angle designed for collimation of light can be based in part on angles of any reflective structures surrounding the side emitting LED package 100, e.g., reflector cones such as illustrated in FIGS. 5 and 6.

In some embodiments, the cap 102 can be referred to as a light reflective encapsulant component. The material from which the cap 102 is fabricated can be formulated by a mixture of resin with fine white particles, for example, a mixture of optical clear silicone with titanium dioxide (TiO2), aluminum oxide (Al2O3), and/or barium oxide (BaO). The composition of the cap 102 and/or the reflective layer 312 can be formulated so that the surface of the cap 102 and/or the reflective layer 312 has light reflectivity of 95% or more. The cap 102 and/or the reflective layer 312 can optionally be formed by laminating, molding, or dispensing material on top of the light converter 104. The purpose of the cap 102 includes inhibiting light emission from the top surface of the side emitting LED package 100, in order to prevent bright spots in displays that include the side emitting LED package 100. A majority of the light emiitted by side emitting LED package 100 can exit out the sides of the light converter 104.

Figure 5:
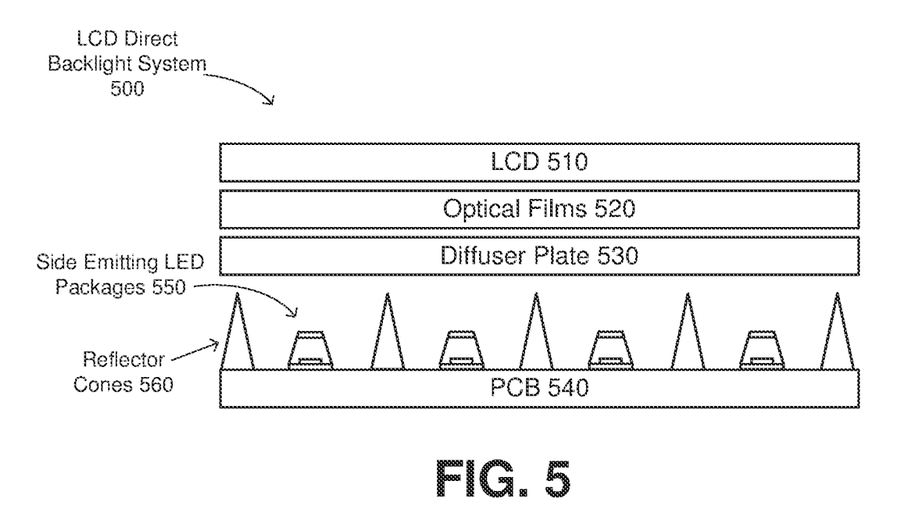
FIG. 5 illustrates an example LED display including side emitting LED packages, in accordance with one or more embodiments described herein.
Figure 6:
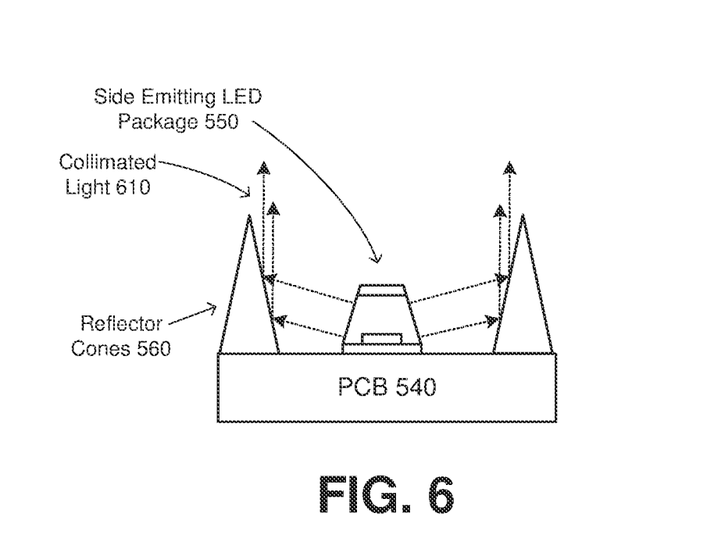
FIG. 6 illustrates example light emission from the LED display of FIG. 5, in accordance with one or more embodiments described herein.

FIG. 5 illustrates an example LED display including side emitting LED packages, in accordance with one or more embodiments described herein. The example LED display is in the form of LCD direct backlight system 500. It can be appreciated that side emitting LED packages such as disclosed herein can also be incorporated into other LED displays, and the LCD direct backlight system 500 is just one example. The LCD direct backlight system 500 includes various stacked layers, including, from top to bottom, LCD 510, optical films 520, diffuser plate 530, and PCB 540, wherein side emitting LED packages 550 and reflector cones 560 are affixed to the PCB 540. The side emitting LED packages 550 can include, e.g., side emitting LED packages described with reference to FIGS. 1-4. The reflector cones 560 can comprise molded plastic structures optionally coated with a reflective coating.

In some embodiments, the LCD direct backlight system 500 can optionally be used as a display in vehicles such as automobiles, motorcycles, airplanes, busses, trains, or other vehicles. Hundreds or thousands of side emitting LED packages 550 and reflector cones 560 can optionally be included in the LCD direct backlight system 500. The LCD direct backlight system 500 can be configured for localized dimming, wherein subsets of the side emitting LED packages 550 can be activated under portions of the LCD direct backlight system 500 in order to enhance contrast ratios and optionally to boost display brightness under sunlight or other high ambient light conditions.

Due to the high number of side emitting LED packages 550 included in the LCD direct backlight system 500, it can be critical for side emitting LED packages 550 to be efficient in terms of light extraction, so that side emitting LED packages 550 can generate strong brightness using available input electrical power. Furthermore the LCD direct backlight system 500 can provide enhanced LED package light extraction, improved optical efficiency, and reduced degradation of the PCB 540 due to light emitted by the side emitting LED packages 550.

With regard to reduced degradation of the PCB 540, the surface of PCB 540 can be coated with white solder mask. The solder mask can comprise, e.g., epoxy resin. Under prolonged radiation of light from side emitting LED packages 550, the epoxy resin can degrade and turn to brown/yellow color. This can also lead to deterioration of light reflection by the PCB 540. Through the use of side emitting LED packages 550 according to this disclosure, the light that radiates to the surface of PCB 540 is reduced and thus the whiteness/reflectivity of the solder mask on the PCB 540 is prolonged. This can effectively improve the reliability and brightness stability of the whole backlight system 500 under prolonged usage.

In as aspect, FIG. 5 illustrates an LED display comprising a PCB 540, side-emitting LED packages 550 affixed to the PCB 540, reflector cones 560 affixed to the PCB 540, and one or more optical layers 510, 520, 530 positioned over the PCB 540, the side-emitting LED packages 550, and the reflector cones 560. The side-emitting LED packages 550 can comprise features introduced in FIGS. 1-4, such as a light converter 104 with an inclined outer side surface which forms an inclined angle with respect to the PCB 540, a cap 102 over the light converter 104, wherein the cap 102 inhibits light directed perpendicular to the PCB 540, an LED chip 106, and a substrate 108. The reflector cones 560 can be distributed among the side-emitting LED packages 550, e.g., in a repeating honeycomb or other pattern.

FIG. 6 illustrates example light emission from the LED display of FIG. 5, in accordance with one or more embodiments described herein. FIG. 6 illustrates a section of the PCB 540 introduced in FIG. 5, along with some of the reflector cones 560 and one of the side emitting LED packages 550 introduced in FIG. 5. FIG. 6 furthermore illustrate collimated light 610.

As can be understood from FIG. 6, the direction of the collimated light 610 can be substantially perpendicular to the PCB 540. The direction of the collimated light 610 is a function of the aggregate light emission angle of the side emitting LED package 550 and the angles of the reflecting surfaces of the reflector cones 560. In some embodiments, the inclined angle employed by the side emitting LED packages 550 can be selected to produce collimated light 610 in view of the angles of the reflecting surfaces of the reflector cones 560.

FIG. 7 is a three-dimensional view of another example side emitting LED package, in accordance with one or more embodiments described herein. The example side emitting LED package 700 can optionally implement the side emitting LED packages illustrated in FIG. 1-6. The side emitting LED package 700 includes a cap 702, a light converter 704, an LED chip 706, and a substrate 708, which can implement like components illustrated in FIGS. 1-6.

The side emitting LED package 700 is generally rectangular in shape, that is, lateral cross sections of the side emitting LED package 700 are rectangular, and optionally square. In other embodiments, other cross section shapes are also feasible such as round or polygonal such as triangular, hexagonal, or otherwise. In the illustrated embodiment, the light converter 704 comprises four outer side surfaces. The outer side surfaces can have a same inclined angle. In other embodiments, the outer side surfaces can have different inclined angles, or opposing faces of the outer side surfaces can have matching inclined angles.

FIG. 7 illustrates the substrate 708 top surface and the LED chip 706 top surface, both of which can comprise flat planar surfaces. The substrate 708 top surface and the LED chip 706 top surface can be parallel. Furthermore, the LED chip 706 side surfaces can comprise flat planar surfaces, which can be perpendicular to the substrate 708 top surface and the LED chip 706 top surface, as shown. The light converter 704 outer side surfaces can likewise comprise flat planar surfaces, which are at an inclined angle, e.g., angle $\Theta_1$ in FIG. 2, with respect to the LED chip 706 side surface, and which are at an inclined angle, e.g., $\Theta_2$ in FIG. 2, with respect to the the substrate 708 top surface and the LED chip 706 top surface.

The side emitting LED package 700 includes at least one LED chip 706 positioned over a substrate 708, wherein the at least one LED chip 706 comprises an LED chip 706 side surface that can be defined by a portion of a first plane.

The side emitting LED package 700 furthermore includes a light converter 704 surrounding the LED chip 706, wherein the light converter 704 comprises a light converter 704 outer side surface that can be defined by a portion of a second plane, and wherein the second plane intersects the first plane at an inclined angle. The light converter 704 can be rectangular, and as such can include four total light converter 704 outer side surfaces. A first light converter 704 outer side surface can be defined by the portion of the second plane, as noted above, while the three additional light converter 704 outer side surfaces can be defined by portions of three additional planes, and each of the three additional planes can intersect planes defined by additional LED chip 706 side surfaces at inclined angles.

The inclined angle(s) employed by the light converter 704 can comprise a collimation angle that collimates light rays that exit the side emitting LED package 700. The inclined angle can be, e.g., from 2-20 degrees. In the horizontal plane, the light converter 704 outer side surfaces can be adapted to emit light in substantially three hundred sixty (360) degrees, i.e., in all directions.

The side emitting LED package 700 furthermore includes a cap 702 positioned over the light converter 704. The cap 702 can comprise a reflective bottom surface that can be defined by a portion of a third plane, wherein the third plane can be perpendicular with the first plane, namely, the plane of the LED chip 706 side surface.

The substrate 708 comprises a substrate top surface that can be defined by a portion of another third plane, and the third plane of the substrate top surface can also be perpendicular with the first plane, namely, the plane of the LED chip 706 side surface. The substrate top surface 708 can comprise a laminate material and optionally a reflective layer as illustrated in FIG. 3. At least one first electrical terminal, e.g., of electrical terminals 110 illustrated in FIG. 1, can be disposed in the substrate 708. The at least one first electrical terminal can be adapted to couple with at least one second electrical terminal of electrical terminals 151 on a PCB.

In another aspect, the side emitting LED package 700 is an example of an LED package comprising a substrate 708, at least one LED chip 706 positioned over the substrate 708, a light converter 704 positioned over the substrate 708 and surrounding the LED chip 706, and a cap 702 positioned over the light converter 704, wherein a first perimeter of the light converter 704 adjacent the substrate 708 is larger than a second perimeter of the light converter 704 adjacent the cap 702. The at least one LED chip 706 can comprise an LED chip side surface that can be defined by a portion of a first plane, the light converter 704 can comprise a light converter outer side surface that can be defined by a portion of a second plane, and the second plane can intersect the first plane at an inclined angle, e.g., from 2-20 degrees.

Figure 8:
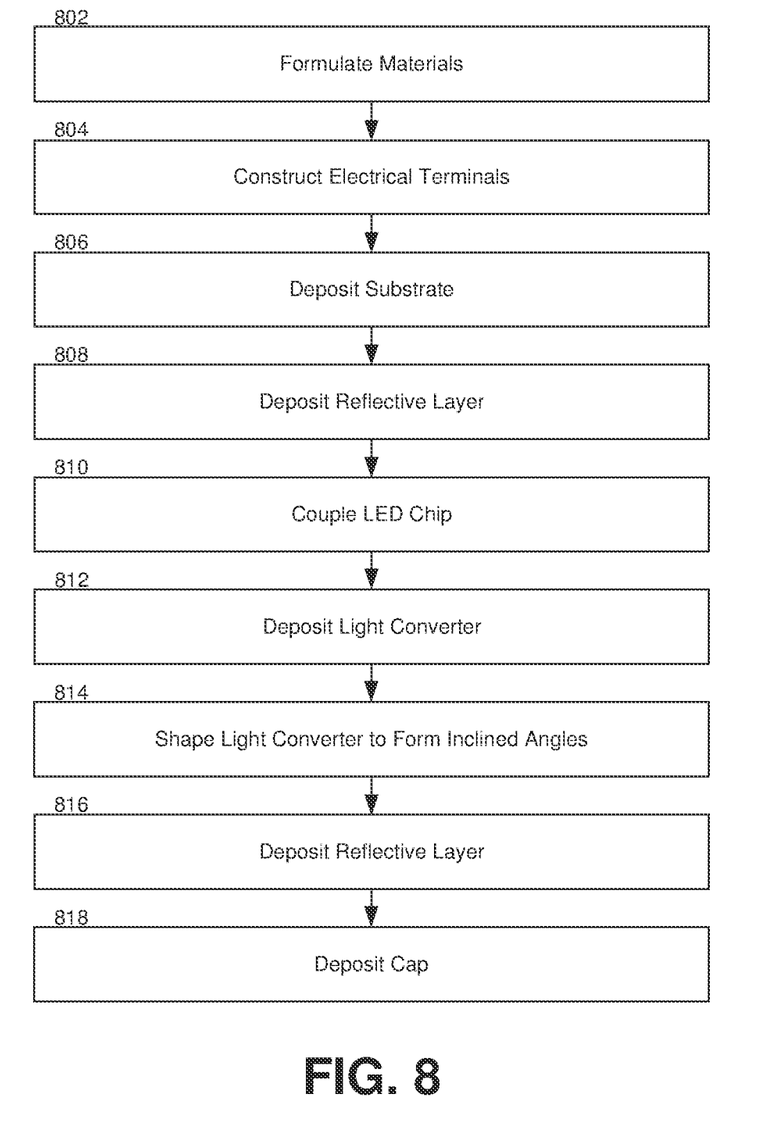
FIG. 8 is a flow diagram of an example method to manufacture a side emitting LED package, in accordance with one or more embodiments described herein.

FIG. 8 is a flow diagram of an example method to manufacture a side emitting LED package, in accordance with one or more embodiments described herein. The blocks of the illustrated method represent operations according to a method, as can be appreciated. While the operations are illustrated in sequence, it can furthermore be appreciated that certain operations can optionally be re-ordered, combined, removed or supplemented with other operations in some embodiments.

FIG. 8 comprises a "Formulate Materials" block 802, a "Construct Electrical Terminals" block 804, a "Deposit Substrate" block 806, "Deposit Reflective Layer" block 808, a "Couple LED Chip" block 810, a "Deposit Light Converter" block 812, a "Shape Light Converter to Form Inclined Angles" block 814, a "Deposit Reflective Layer" block 816, and a "Deposit Cap" block 818.

At "Formulate Materials" block 802, the materials described herein for making the substrate 108, reflective layer 311, light converter 104, reflective layer 312, and cap 102 can be mixed in appropriate proportions as desired for particular embodiments. At "Construct Electrical Terminals" block 804, the electrical terminals 110 can be, e.g., positioned in a mold. At "Deposit Substrate" block 806, the formulated material for substrate 108 can deposited in a layer surrounding the electrical terminals 110. At "Deposit Reflective Layer" block 808, the formulated material for reflective layer 311 can deposited in a layer over the substrate 108, and optionally polished or otherwise treated for high reflectivity. At "Couple LED Chip" block 810, the LED chip 106 can be coupled over the substrate and adhered to the substrate and electrical terminals 110 using the techniques described herein. At "Deposit Light Converter" block 812, the formulated material for light converter 104 can deposited in a layer over the substrate 108 and reflective layer 311. At "Shape Light Converter to Form Inclined Angles" block 814, the light converter 104 can be cut or otherwise shaped to form the desired inclined angles of the outer sides of the light converter 104. At "Deposit Reflective Layer" block 816, the formulated material for reflective layer 312 can deposited in a layer over the light converter 104. At "Deposit Cap" block 818, the formulated material for the cap 102 can deposited in a layer over the light converter 104 and reflective layer 312. Once fabricated, a side emitting LED package can be soldered or otherwise electrically coupled onto a PCB to build an LED display.

The above description includes non-limiting examples of the various embodiments. It is, of course, not possible to describe every conceivable combination of components or methodologies for purposes of describing the disclosed subject matter, and one skilled in the art may recognize that further combinations and permutations of the various embodiments are possible. The disclosed subject matter is intended to embrace all such alterations, modifications, and variations that fall within the spirit and scope of the appended claims.

With regard to the various functions performed by the above-described components, the terms (including a reference to a "means") used to describe such components are intended to also include, unless otherwise indicated, any structure(s) which performs the specified function of the described component (e.g., a functional equivalent), even if not structurally equivalent to the disclosed structure. In addition, while a particular feature of the disclosed subject matter may have been disclosed with respect to only one of several implementations, such feature may be combined with one or more other features of the other implementations as may be desired and advantageous for any given or particular application.

The terms "exemplary" and/or "demonstrative" as used herein are intended to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent structures and techniques known to one skilled in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

The term "or" as used herein is intended to mean an inclusive "or" rather than an exclusive "or." For example, the phrase "A or B" is intended to include instances of A, B, and both A and B. Additionally, the articles "a" and "an" as used in this application and the appended claims should generally be construed to mean "one or more" unless either otherwise specified or clear from the context to be directed to a singular form.

The term "set" as employed herein excludes the empty set, i.e., the set with no elements therein. Thus, a "set" in the subject disclosure includes one or more elements or entities. Likewise, the term "group" as utilized herein refers to a collection of one or more entities.

The terms "first," "second," "third," and so forth, as used in the claims, unless otherwise clear by context, is for clarity only and doesn't otherwise indicate or imply any order in time. For instance, "a first determination," "a second determination," and "a third determination," does not indicate or imply that the first determination is to be made before the second determination, or vice versa, etc.

The description of illustrated embodiments of the subject disclosure as provided herein, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as one skilled in the art can recognize. In this regard, while the subject matter has been described herein in connection with various embodiments and corresponding drawings, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A light emitting diode (LED) package, comprising:
at least one LED chip positioned over a substrate, wherein the at least one LED chip comprises an LED chip side surface that can be defined by a portion of a first plane;
a light converter surrounding the LED chip, wherein the light converter comprises a light converter outer side surface that can be defined by a portion of a second plane, and wherein the second plane intersects the first plane at an inclined angle; and
a cap positioned adjacent to and in contact with the light converter and characterized by continuous contact between the cap and a top surface of the light converter across an entirety of a bottom surface of the cap, wherein area of the bottom surface of the cap is less than area of the light converter adjacent to the substrate.

2. The LED package of claim 1, wherein the substrate comprises a substrate top surface that can be defined by a portion of a third plane, and wherein the third plane is perpendicular with the first plane.

3. The LED package of claim 2, wherein the substrate top surface comprises a reflective layer.

4. The LED package of claim 1, wherein the substrate comprises a laminate material.

5. The LED package of claim 1, further comprising at least one first electrical terminal in the substrate, wherein the at least one first electrical terminal is adapted to couple with at least one second electrical terminal on a printed circuit board (PCB).

6. The LED package of claim 1, wherein the at least one LED chip comprises an indium gallium nitride (InGaN) type LED chip.

7. The LED package of claim 1, wherein the at least one LED chip comprises a flip chip base, a vertical chip base, or a lateral chip base.

8. The LED package of claim 1, wherein the at least one LED chip is attached to the substrate using eutectic full metal bonding or using an adhesive.

9. The LED package of claim 1, wherein the light converter comprises a mixture of resin and light conversion particles.

10. The LED package of claim 9, wherein the resin is one or more of epoxy based and silicone based.

11. The LED package of claim 9, wherein the light conversion particles comprise phosphor particles.

12. The LED package of claim 1, wherein the inclined angle comprises a collimation angle that collimates light rays that exit the LED package.

13. The LED package of claim 1, wherein the inclined angle is from 2-20 degrees.

14. The LED package of claim 1, wherein the light converter comprises light converter outer side surfaces, including the light converter outer side surface, which are adapted to emit light in substantially three hundred sixty (360) degrees.

15. The LED package of claim 1, wherein the light converter comprises a rectangular light converter bottom portion adjacent to the substrate, wherein the light converter outer side surface is a first light converter outer side surface, and wherein three additional light converter outer side surfaces can be defined by portions of three additional planes, and wherein each of the three additional planes intersect planes defined by additional LED chip side surfaces at inclined angles.

16. The LED package of claim 1, wherein the cap comprises a reflective bottom surface that can be defined by a portion of a third plane, and wherein the third plane is perpendicular with the first plane.

17. The LED package of claim 1, wherein the cap comprises a mixture of resin and white particles.

18. A light emitting diode (LED) package, comprising:
 a substrate;
 at least one LED chip positioned over the substrate;
 a light converter positioned over the substrate and surrounding the LED chip; and
 a cap positioned adjacent to and in contact with the light converter and characterized by continuous contact between the cap and a top surface of the light converter across an entirety of a bottom surface of the cap;
 wherein a first perimeter of the light converter adjacent the substrate is larger than a second perimeter at the top surface of the light converter adjacent the cap, wherein contact area with the cap at second perimeter is less than contact area with the substrate at the first perimeter.

19. The LED package of claim 18, wherein the at least one LED chip comprises an LED chip side surface that can be defined by a portion of a first plane, wherein the light converter comprises a light converter outer side surface that can be defined by a portion of a second plane, and wherein the second plane intersects the first plane at an inclined angle from 2-20 degrees.

20. A light emitting diode (LED) display, comprising:
 a printed circuit board (PCB);
 side-emitting LED packages affixed to the PCB, each of the side-emitting LED packages comprising:
 a light converter with an inclined outer side surface which forms an inclined angle with respect to the PCB; and
 a cap over the light converter, wherein the cap inhibits light directed perpendicular to the PCB, wherein the cap is characterized by continuous contact between the cap and a top surface of the light converter across an entirety of a bottom surface of the cap, and wherein surface area at the bottom surface of the cap is less than surface area at a bottom surface of the light converter;
 reflector cones affixed to the PCB, wherein the reflector cones are distributed among the side-emitting LED packages; and
 one or more optical layers positioned over the PCB, side-emitting LED packages, and reflector cones.

\* \* \* \* \*